United States Patent [19]

Stanford

[11] 4,115,735
[45] Sep. 19, 1978

[54] TEST FIXTURE EMPLOYING PLURAL PLATENS FOR ADVANCING SOME OR ALL OF THE PROBES OF THE TEST FIXTURE

[75] Inventor: Melvin E. Stanford, Latham, N.Y.

[73] Assignee: Faultfinders, Inc., Latham, N.Y.

[21] Appl. No.: 732,531

[22] Filed: Oct. 14, 1976

[51] Int. Cl.² ................. G01R 31/02; G01R 15/12
[52] U.S. Cl. ..................... 324/158 F; 324/73 PC
[58] Field of Search ........... 324/158 F, 158 P, 51, 324/73 PC, 73 AT, 73 R; 200/46; 339/18 R, 18 P, 75 M, 75 MP, 117 P; 269/21

[56] References Cited

U.S. PATENT DOCUMENTS

| 3,016,489 | 1/1962 | Briggs et al. | 339/117 P |
| 3,176,091 | 3/1965 | Hanson et al. | 200/46 |
| 3,543,214 | 11/1970 | Johnston | 339/117 P |
| 3,714,572 | 1/1973 | Ham et al. | 324/158 F |
| 4,017,793 | 4/1977 | Haines | 324/158 F |

OTHER PUBLICATIONS

"Your Answer . . . "; Faultfinders Inc., 15 Avis Dr., Latham, N. Y. 12110; Aug. 1975; pp. 1-8.

Primary Examiner—Gerard R. Strecker
Assistant Examiner—Ernest F. Karlsen
Attorney, Agent, or Firm—Heslin, Irwin & Nieman

[57] ABSTRACT

A test fixture for a circuit board testing system having a plurality of probes, some of which are mounted on one platen and others on another within the fixture. The platens are selectively advanced by use of a vacuum and thereby the probes associated with each platen are advanced into contact with the circuit board under test.

18 Claims, 6 Drawing Figures

TEST FIXTURE EMPLOYING PLURAL PLATENS FOR ADVANCING SOME OR ALL OF THE PROBES OF THE TEST FIXTURE

BACKGROUND OF THE INVENTION

This invention relates to the field of automatic testing of electronic circuit boards, and, more particularly, relates to test fixtures used in automatic test systems.

In recent years, automatic test systems have been developed for the testing of circuit boards prior to their being installed in ultimate products. For example, a manufacturer of television sets might utilize an automatic test system to verify that all the circuit boards for a set are good before installing them in the set. Some testing systems have the capability of performing both in-circuit tests and functional tests. In-circuit tests involve the testing of the discrete components on a circuit board by electrically isolating each component and subjecting it to known test voltages and currents and measuring its output. The electrical isolation of components requires the use of numerous electrical probes which contact the circuit under test at predetermined nodal points. This can involve the use of 1,000 or more probes depending upon the circuit under test. A functional test involves the introduction of a test signal on the input leads of a circuit board and measurement of the response on its output leads to determine whether the board functions overall in the intended manner. Again, the contact with the input leads and output leads is typically made by means of electrical probes which, in turn, are connected to the test system.

It is, of course, well known to those skilled in the art that the presence of a great number of probes in electrical contact with the circuit under test produces certain undesirable inductance and capcitance effects in the circuit. Naturally, the test results are distorted to some extent and the degree of distortion must be taken into account in interpreting the test results. These unwanted inductance and capacitance factors are particularly undesirable in functional tests. Therefore, it would be desirable if only those probes necessary for a functional test would be brought into contact with the circuit board during such tests. Various attempts have been made to provide a test fixture which would have the capability of advancing only selected probes for different parts of an automatic test program. For example, U.S. Pat. No. 3,714,572 discloses a fixture in which the individual probes are pneumatically advanced into contact with the circuit under test. While test fixtures of this type would appear to eliminate unwanted inductance and capacitance effects, there are certain disadvantages involved. For one thing, as the number of probes needed becomes large, such test fixtures become unduly expensive. Secondly, because of the minimum practical size of the cylinders involved, there is a limitation as to how close one probe can be placed to another. The presence of a large number of cylinders adds unnecessarily to the bulk of these test fixtures. The need for valving and conduits for such individual probe, as well as cam-operated controls, introduces a significant level of complexity in test fixtures of this kind. With this type of test fixture, it is necessary to provide clamps or other devices which will hold the circuit board under test in place as the probes are advanced into contact with it during the test.

As is well known to those skilled in the art, another type of test fixture utilizes a vacuum to hold the circuit board in place during the test and to cause the test probes to advance into contact with the board. With fixtures of this kind, the circuit boards are placed on and removed from the test fixture more readily since there are no clamps or other devices to be manipulated. This tends to reduce the cycle time needed to test each board, thereby increasing productivity. As noted above, some modern test systems are capable of conducting both functional and in-circuit tests. It would, therefore, be desirable to provide a vacuum operated test fixture which would have the capability of advancing at one time only those probes necessary to conduct a functional test of the board and to advance all probes at another time to conduct the in-circuit tests. It would be particularly desirable if a test fixture of this type could be produced at a relatively economical cost through the introdcution of a few new parts to existing vacuum-operated fixtures.

SUMMARY OF THE INVENTION

It is, therefore, an object of this invention to provide a test fixture having the capability of advancing at one time only those probes which are necessary to conduct a functional test of the circuit board and to advance at another time all of the test probes needed to conduct the in-circuit tests.

It is also an object of this invention to provide a test fixture of the type indicated which can be adapted for use in systems which employ vacuum for the operation of their fixtures.

It is also an object of this invention to provide a test fixture of the type indicated which will be relatively uncomplicated, economical to produce and reliable in operation.

The above objects are accomplished by the present invention. Selected groups of probes in a test fixture are each mounted on a platen which can be advanced individually or in unison with other platens in order to advance the probes thereon into contact with the circuit under test.

BRIEF DESCRIPTIONS OF THE DRAWINGS

Figure 1:
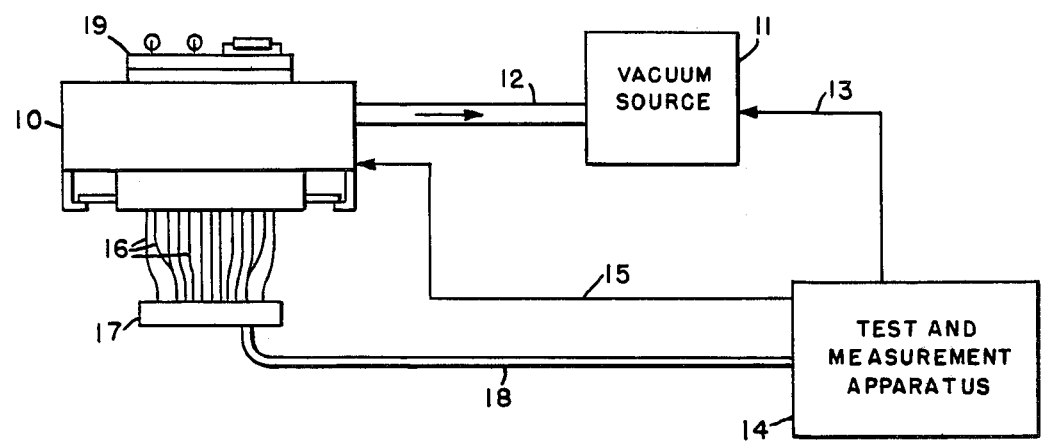
FIG. 1 is a side elevation of a test fixture according to the present invention showing schematically the system in which such a test fixture is employed.

In FIG. 1, there is depicted in schematic form an automatic test system employing a test fixture. The fixture 10 is shown as being in communication with a vacuum source 11 by means of a suitable conduit 12. The vacuum source is connected by means of one or more wires represented by line 13 to a test and measurement apparatus 14. The test and measurement apparatus would ordinarily be an automatic test system which may be programmed to conduct tests appropriate to the circuit board in question. Additional electrical connections are represented by line 15 from the test apparatus 14 to fixture 10. A series of electrical leads 16 represent the lines leading to the various probes contained within the fixture. These lines are customarily gathered in a coupling device 17 which is typically a plug board. After passing through the coupling device 17, the individual electrical lines 16 are connected to the test apparatus 14 by means of cable 18.

At the beginning of a test cycle, a circuit board 19 is placed on the test fixture 10. On command from the test apparatus 14, vacuum source 11 is activated thereby creating a vacuum within the fixture and tending to draw the circuit board under test tightly against the top of the fixture and holding it in place. The creation of the vacuum within the fixture also causes some or all of the probes to be advanced into contact with the circuit board in a manner to be described in detail hereinafter. During the test, various signals are transmitted and received via cable 18 and leads 16 and the results are analyzed by the tester 14 and presented through suitable read-out equipment.

Figure 2:
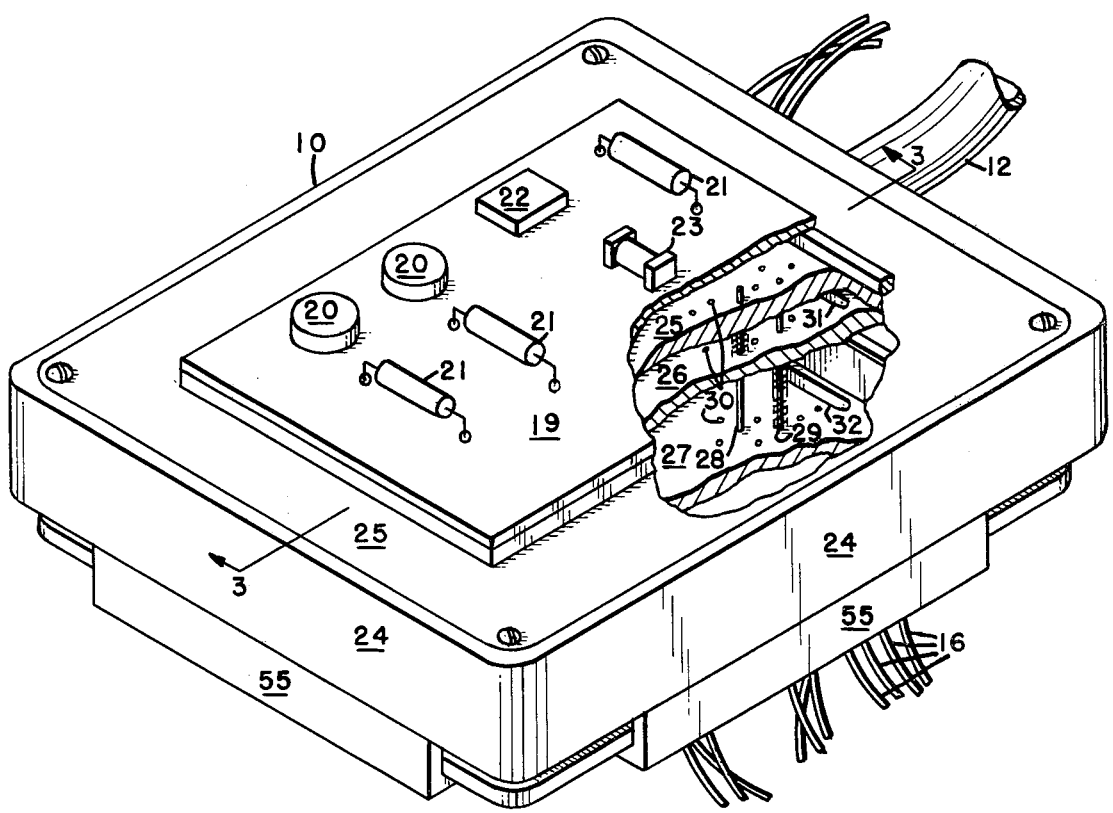
FIG. 2 is a perspective view of a test fixture according to the present invention, with parts broken away.

Referring now to FIG. 2, there is shown a test fixture according to the present invention. Circuit board 19 contains a number of discrete components 20–23 which form part of the circuit being tested. As is well known, the underside of circuit board 19 has exposed thereon a number of conductor paths printed thereon which serve to interconnect discrete components 20–23. The test fixture is encased within a housing 24, top plate 25 and brackets 55. Within the fixture there is shown the platens 26 and 27 and probes 28 and 29. Additional probes would be associated with the various holes 30 depicted in the platens and top plate 25. It should be noted that platens 26 and 27 are provided with elongated slots or ports 31 and 32.

Figure 3:
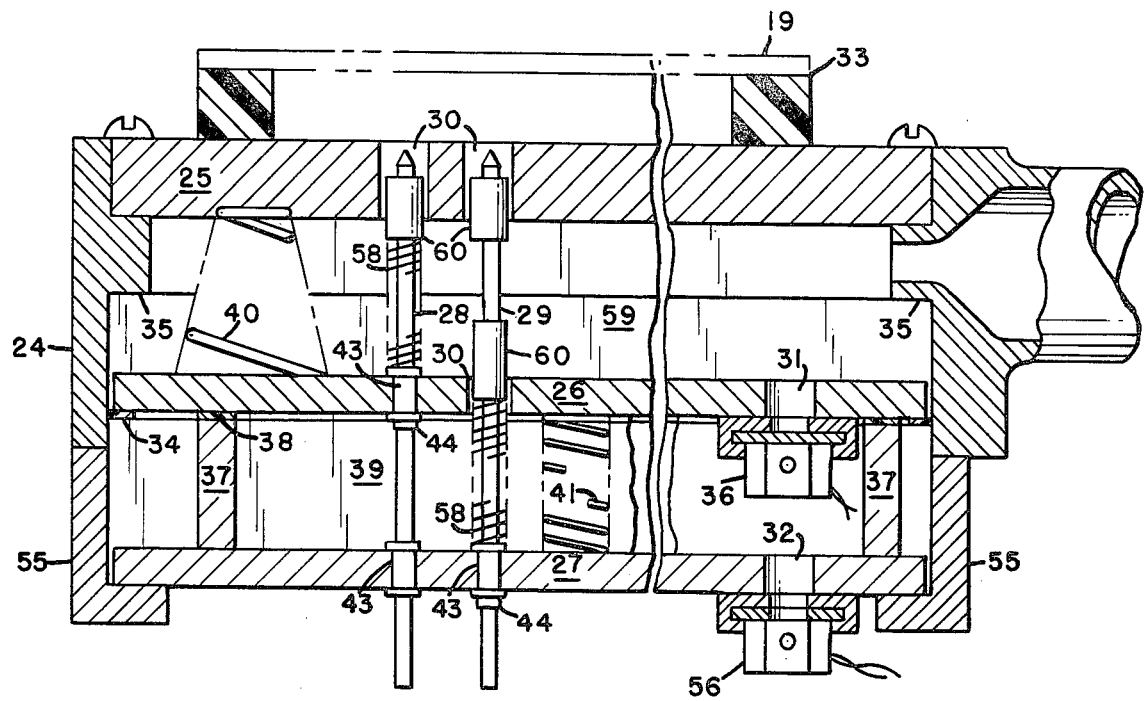
FIG. 3 is a cross-sectional view taken on line 3—3 of FIG. 2 and showing the probes in a restracted state.

Referring now to FIG. 3, it will be seen that circuit board 19 is resting on a gasket 33. Gasket 33 may be any suitable material such as neoprene, which will provide a good seal around the outer edges of a circuit board 19 when the interior of the fixture is evacuated. Also, an airtight seal is made between housing 24 and top plate 25. Platens 26 and 27 are shown within the housing 24 and brackets 55, which are, in effect, an extension of housing 24. Platen 26 is provided with a resilient sealing member 34 around its periphery in order to make a substantially airtight seal between it and housing 24. The seal 34 and the dimensions of platen 26 are such as to permit platen 26 to slide or advance upwardly until contact is made with shoulder 35. Port 31 is provided with a valve 36 which will be described in detail hereinafter.

Figure 4:
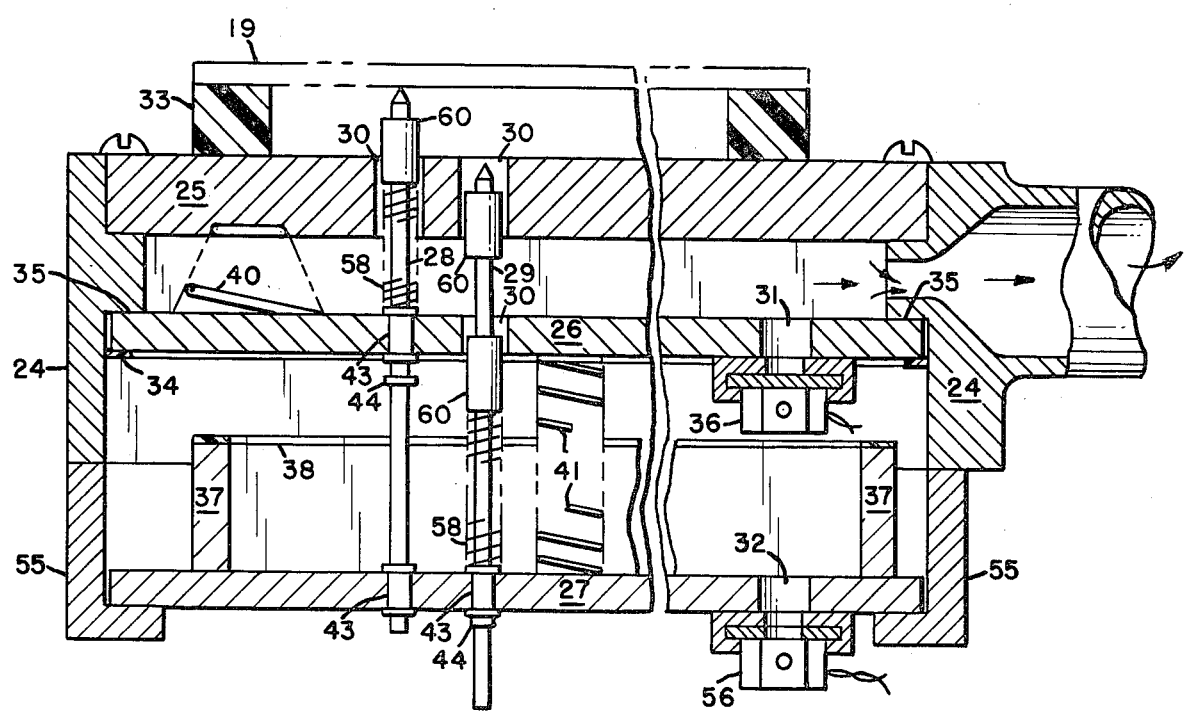
FIG. 4 is the same view as that shown in FIG. 3, but with some of the test probes advanced into contact with the circuit board.

Referring now to FIG. 4, platen 27 is shown as resting on brackets 55. Like platen 26, platen 27 is fitted within brackets 55 so as to be free to slide or advance upwardly. Mounted on platen 27 is a four-sided wall 37 which is somewhat inset from the edges of platen 27. A sealing member 38, such as a neoprene gasket is mounted along the top of wall 37. Referring again to FIG. 3, it will be appreciated that when platen 26 rests on sealing member 38, as shown in that figure, a relatively airtight chamber 39 is formed between platens 26 and 27 within the wall 37, depending upon the condition of valves 36 and 56.

A series of springs 40 are provided between top plate 25 and platen 26, although only one such spring is shown for simplicity. Similarly, a series of springs 41 are provided between platens 26 and 27. These springs serve several purposes. The springs 40 can be strategically placed so as to prevent warping of platen 26 when it is advanced upwardly by evacuation of the chamber 59. Springs 40 also serve to cause the retraction of platens 26 and 27 at certain times, as will be discussed below. The spring 41 serve to hold platen 27 in place when only platen 26 is to be advanced. The strength of springs 40 is relatively greater than that of springs 41 in order to insure an adequate seal between platens 26 and 27 at various times to be hereinafter described.

Figure 5:
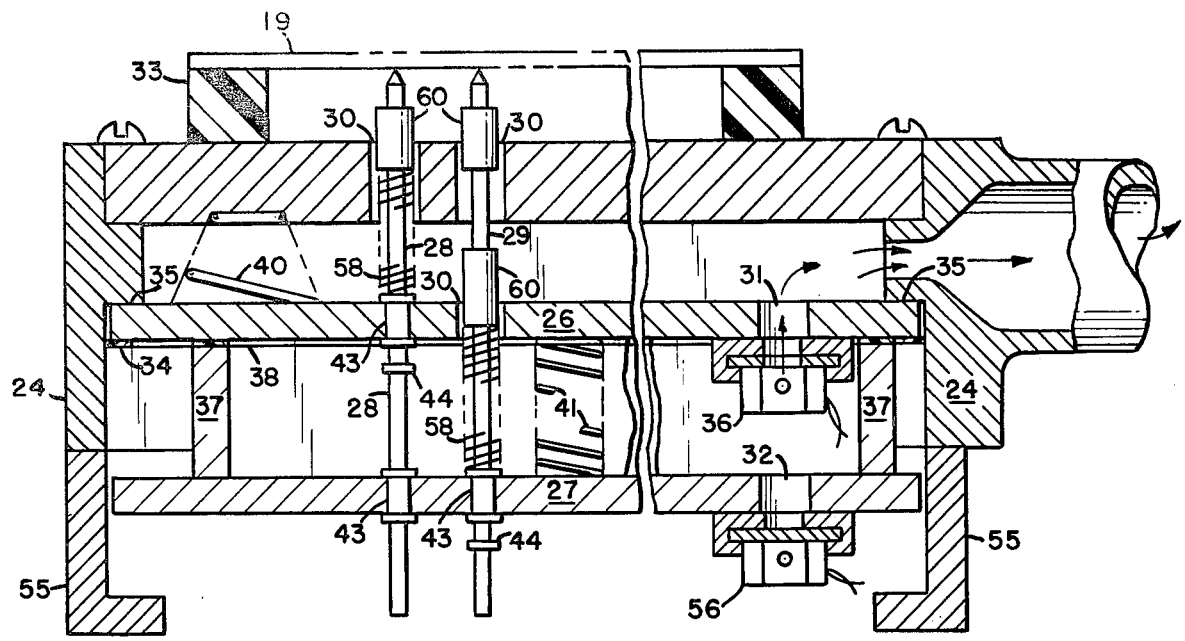
FIG. 5 is the same view as that shown in FIG. 3, but with all probes advanced.

Probes 28 and 29 extend into top plate 25 and through platens 26 and 27. Although not shown in FIGS. 3–5, it is to be understood that each probe has a lead wire 16, as shown in FIGS. 1 and 2, connected to it. Although, for simplicity, only one probe 28 and one probe 29 are shown, it should be understood that there are ordinarily many probes of each type which have identical structures and functions. Guides 43 are provided in platens 26 and 27 where indicated for probes 28 and 29. The probes 28 and 29 are slideably fit within guides 43. An eyelet 44 is snugly fit on probe 28 below guide 43 at platen 26. An eyelet 44 is snugly fit on probe 29 below guide 43 at platen 27. Thus, probe 28 cannot move or advance upwardly unless platen 26 is advanced. Likewise, probe 29 cannot advance upwardly unless platen 27 is advanced. Sleeves 60 on probes 28 and 29 are slideably fit within holes 30 in platen 26 and top plate 25. The fit between the guides 43 and probes 28 and 29 and between sleeves 60 and platen 26 and top plate 25 is sufficiently tight to permit a vacuum to be maintained within the fixture, as hereinafter described. Springs 58 are provided on probes 28 and 29 as indicated in FIG. 3. The result of this arrangement of guides 43, eyelets 44, springs 58 and sleeves 60 is that probe 28 is resiliently mounted on platen 26 while probe 29 is resiliently mounted on platen 27.

Figure 6:
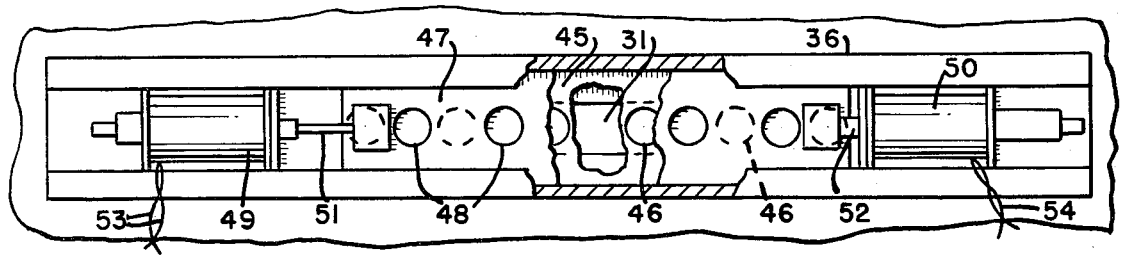
FIG. 6 is a detailed view of a valve employed in the invention.

Ports 31 and 32 in platen 26 and 27 respectively are provided with valves 36 and 56. These valves are identical in structure and operation and valve 36 is shown in FIG. 6 in detail. Each valve spans the length and width of its associated port. As shown in FIG. 6, valve 36 is provided with a stationary member 45 having a series of holes 46 in it. It is also provided with a movable member 47 having a series of holes 48. Push-type solenoids 49 and 50 are connected with movable plate 47 by means of push-rods 51 and 52. In FIG. 6, solenoid 49 has been fired pushing member 47 to the right causing the holes 46 to be misaligned with holes 48. Thus, the valve is closed. If solenoid 50 were to be fired, moving holes 48 into alignment with holes 46, the valve would be open. The wires 53 and 54 are gathered within conduit 15 for connection with test apparatus 14.

A test cycle begins when the operator of the test system places a circuit board 19 on test fixture 10. Once the circuit board is in place, the operator would initiate the testing program by activating the test apparatus 14. As mentioned earlier, the test apparatus may conduct both in-circuit tests and functional tests. At the point in the test cycle when a functional test is to be performed, the test apparatus will cause electrical pulses to be conducted through lines 15 to the solenoids of valves 36 and 56. For a functional test, only certain probes are required. As shown in this embodiment, these probes would be mounted like probes 28 on platens 26 and only platen 26 need be advanced. Thus, the signals from the test apparatus 14 to the solenoids will be such that valve 36 will be closed and valve 56 will be opened. Once the valves have been set, the tester 14 will activate the vacuum source 11 causing circuit board 19 to be drawn down tightly against gasket 33 and also causing plate 26 to advance as indicated in FIG. 4. As platen 26 advances, probes 28 will likewise be urged upwardly by springs 58. When the tip of probe 28 makes contact with the circuit board, its upward travel ceases. However, the upward travel of platen 26 continues against the resistance of springs 58. This results in creating pressure between the tip of probes 28 and the associated contact points on the underside of circuit board 19. It can be noted in FIG. 4 that when probes 28 are advanced, as shown, a slight gap occurs between the guide 43 and eyelet 44 along the shaft of the probe. After the functional test has been completed, the vacuum source is deactivated on command from the tester 14. With the vacuum released, springs 40 and 58 will urge platen 26 into its retracted position, as shown in FIG. 3. When the base of guide 43 comes in contact with eyelet 44, probe 28 will be withdrawn from its contact with circuit board 19 and returned to its original position.

For an in-circuit test, all probes are utilized. Therefore, at the beginning of the in-circuit test, valve 36 would be open and valve 56 would be closed. Once test apparatus 14 activates the vacuum source, both platens 26 and 27 are advanced upwardly into the positions shown in FIG. 5. The vacuum causes an upward force to be experienced by platen 27 causing it to advance as shown. As platen 27 advances, wall 37 forces platen 26 to advance as well. The action of probes 28 is identical to their action during a functional test as described above. The action of probes 29 is similar. Platen 27 advances somewhat beyond the point where the tip of probes 29 make contact with their associated contact points on circuit board 19. This causes additional pressure between the tips of probes 29 and circuit board 19 due to the action of springs 58. A gap appears between eyelet 44 and guide 43 as the guide slides upwardly on each probe 29. Once the in-circuit test is complete, the vacuum is released and the platens will withdraw to the positions shown in FIG. 3. As guides 43 make contact with their corresponding eyelets 44, the probes will be withdrawn as the platens retract.

There are clearly a number of modifications which could be made to the embodiment to this invention, as described above. For example, the housing 24, which is normally a casting, could be deepened in order to eliminate the need for brackets 55. Then, if platen 27 were provided with a seal like seal 34 on platen 26, there would be no need for walls 37 and seals 38. Of course, wall 37 could be retained as a means of forcing platen 26 to advance with platen 27. However, a suitable servo mechanism could be installed for this purpose. With the servo withdrawn, it would then be possible to advance platen 27 without advancing platen 26.

Other modifications could be made to accommodate situations where several different groups of probes are to be advanced. In such situations, the housing 24 could be further deepened in order to accommodate more platens. With appropriate valving and mounting of the probes on the various platens and the use of servo mechanisms, as described above, one could then cause various combinations of the platens and their associated probes to advance.

This invention could likewise be modified for use without a vacuum source. Clearly, a number of platens could be provided within a housing in a manner similar to that described in FIGS. 2 through 5. The advancement of the various platens could then be brought about through the use of electrically or pneumatically operated devices. Suitable switching could be provided in order to advance various combinations of the platens. In the absence of a vacuum, it would then be necessary to provide hold down devices for circuit board 19.

It would seem that all modifications of the type described above are within the spirit of this invention. It is intended to encompass all such modifications within the scope of the following claims.

I claim:

1. An improved circuit board testing system of the type having a test fixture for holding the circuit board being tested, said fixture containing a plurality of electrically conductive probes connected to the system and having tips for making electrical contact with selected points on the circuit board under test, wherein the improvement comprises:

a plurality of stacked and spaced-apart platens, each having a predetermined number of the probes mounted substantially upright thereon with their tips pointing substantially in the same direction and each platen having apertures therein through which probes mounted on other platens may slideably pass;

means for holding the circuit board under test and the platens in a stacked and spaced-apart relationship so that the tips of the probes mounted on a particular platen will make contact with the circuit board when that platen is advanced toward the circuit board; and means for selectively advancing one or more platens toward the circuit board being tested whereby the tips of the probes mounted thereon will be brought into contact with their associated points in the circuit under test.

2. The invention of claim 1 wherein the advancing means are vacuum means.

3. The invention of claim 2 wherein the holding means includes a housing, the vacuum means includes a vacuum source communicating with the interior of the housing, the platens are slideably mounted within the housing and each is adapted to be advanced upon application of a vacumm thereto, each platen is provided with a port and wherein each port is provided with independently operable valves for opening and closing them.

4. A test fixture for use in a printed circuit board testing system comprised of:

a plurality of electrically conductive probes having tips and connected to the system for making electrical contact with selected points in the circuit under test;

a plurality of stacked and spaced-apart platens, each having a predetermined number of probes mounted substantially upright thereon with their tips pointing substantially in the same direction and each platen having apertures therein through which probes mounted on other platens may slideably pass;

means for holding the circuit board under test and the platens in a stacked and spaced-apart relationship so that the tips of the probes mounted on a particular platen will make contact with the circuit board when that platen is advanced toward the circuit board; and means for selectively advancing one or more platens toward the circuit board being tested whereby the tips of the probes mounted thereon will be brought into contact with their associated points in the circuit under test.

5. The invention of claim 4 wherein the advancing means are vacuum means.

6. The invention of claim 5 wherein the holding means includes a housing, the vacuum means includes a vacuum source communicating with the interior of the housing, the platens are slideably mounted within the housing and each is adapted to be advanced upon application of a vacuum thereto, each platen is provided with a port and wherein each port is provided with independently operable valves for opening and closing them.

7. An improved circuit board testing system of the type having a fixture adapted to accept the circuit board being tested, said fixture containing a plurality of electrically conductive probes for making electrical contact with selected points on the circuit board under test, and having vacuum means adapted to evacuate the interior of the test fixture both for holding the circuit board in place during a test and for causing the probes to be advanced into electrical contact with the circuit board being tested, wherein the improvement comprises:
- a first means responsive to the vacuum means, when actuated, for simultaneously advancing only a predetermined number of probes into contact with their associated points;
- a second means responsive to the vacuum means, when actuated, for simultaneously advancing all the probes into contact with their associated points; and
- switching means for selectively actuating the first advancing means or the second advancing means.

8. The invention of claim 7 wherein the predetermined number of probes are mounted on a first platen and the other probes are mounted on a second platen and wherein the first advancing means is adapted to advance the first platen and the second advancing means is adapted to advance the first and the second platens.

9. The invention of claim 8 wherein the fixture includes a housing, the vacuum means includes a vacuum source communicating with the interior of the housing, the platens are slideably mounted within the housing so that the first platen can advance alone and will advance whenever the second platen advances, each platen is provided with a port and wherein the switching means are comprised of independently operable valves for opening and closing said ports.

10. The invention of claim 9 wherein the testing system is of the type used to conduct functional tests and in-circuit tests and wherein the probes advanced by the first platen are only those required for the functional test.

11. The invention of claim 10 wherein bias means are provided for returning the platens to their original positions whenever the vacuum source is disconnected.

12. An improved test fixture for use in a printed circuit board testing system, said test fixture being of the type adapted to accept the printed circuit board being tested and containing a plurality of electrically conductive probes for making electrical contact with selected points on the circuit board under test, and said fixture further being of the type utilizing associated vacuum means to evacuate its interior both for holding the printed circuit board in place during a test and for advancing the probes into electrical contact with the board, wherein the improvement comprises:
- first means for simultaneously advancing, when actuated, only a predetermined number of the probes into contact with their associated points;
- second means for simultaneously advancing, when actuated, all of the probes into contact with their associated points; and
- switching means for selectively actuating the first advancing means or the second advancing means.

13. The invention of claim 12 wherein the predetermined number of probes are mounted on a first platen and the other probes are mounted on a second platen and wherein the first advancing means is adapted to advance the first platen and the second advancing means is adapted to advance the first and the second platens.

14. The invention of claim 13 wherein the first advancing means and the second advancing means are vacuum means.

15. The invention of claim 14 wherein the fixture includes a housing, the vacuum means includes a vacuum source communicating with the interior of the housing, the platens are slideably mounted within the housing so that the first platen can advance alone and will advance whenever the second platen advances, each platen is provided with a port and wherein the switching means are comprised of independently operable valves for opening and closing said ports.

16. The invention of claim 15 wherein bias means are provided for returning the platens to their original positions whenever the vacuum source is disconnected.

17. A test fixture for use in a printed circuit board testing system comprising:
- a housing;
- a plurality of platens, stacked and slideably mounted in the housing with sufficient space between each platen for movement toward and away from the printed circuit board under test;
- a plurality of electrically conductive probes for making electrical contact with selected points in the circuit under test, each of said probes being associated with only one platen so that the advancing of a platen will cause all probes associated with that platen to come into contact with the printed circuit board, each of said probes being slideably fit through all platens except the platen with which it is associated, and the axis of each probe pointing in a direction in which the platens slide; and
- a means for selectively advancing one or more platens toward the printed circuit board under test.

18. An improved method for connecting selected points on a printed circuit board to an electrical apparatus, said method being of the type wherein electrically conductive probes are advanced into contact with said circuit board, wherein the improvement comprises the steps of:
- providing a housing having a top with an opening therein to permit probes to pass therethrough;
- slideably mounting a plurality of platens in stacked, spaced-apart relationship within said housing, each platen being substantially parallel to the top;
- resiliently mounting a group of electrically conductive probes on each platen, each probe being connected to the electrical apparatus and each probe slideably fit through each of the platens above it; and
- selectively advancing one or more of the platens toward the printed circuit board until the probes mounted thereon make contact with said printed circuit board.

* * * * *